(12) United States Patent
Matsui et al.

(10) Patent No.: US 6,590,505 B1
(45) Date of Patent: Jul. 8, 2003

(54) REMOTE CONTROL SYSTEM

(75) Inventors: Noriaki Matsui, Fukui (JP); Yoichi Hatano, Fukui (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/570,765

(22) Filed: May 15, 2000

(30) Foreign Application Priority Data

May 14, 1999 (JP) .......................................... 11-133823

(51) Int. Cl.⁷ .............................................. G08C 19/00
(52) U.S. Cl. ........................... 340/825.72; 340/825.57; 340/825.69; 455/603; 358/194.1
(58) Field of Search ................. 340/825.72, 825.24, 340/825.25, 825.57, 825.69; 455/41, 603; 348/194.1

(56) References Cited

U.S. PATENT DOCUMENTS

| | | | |
|---|---|---|---|
| 4,623,887 A | * 11/1986 | Welles, II | 340/825.57 |
| 5,028,919 A | 7/1991 | Hidaka | 340/825.72 |
| 5,142,397 A | 8/1992 | Dockery | 359/145 |
| 5,235,414 A | 8/1993 | Cohen | 358/84 |
| 5,379,453 A | 1/1995 | Tigwell | 455/151.2 |
| 5,537,463 A | 7/1996 | Escobosa et al. | 379/102 |
| 5,565,855 A | 10/1996 | Knibbe | 340/825.06 |
| 5,606,443 A | 2/1997 | Sgambati | 359/143 |
| 5,815,108 A | 9/1998 | Terk | 341/176 |
| 5,819,294 A | 10/1998 | Chambers | 704/104 |

FOREIGN PATENT DOCUMENTS

DE        40 25 302        2/1992

* cited by examiner

*Primary Examiner*—Michael Horabik
*Assistant Examiner*—M Shimizu
(74) *Attorney, Agent, or Firm*—RatnerPrestia

(57) ABSTRACT

A remote control system enables simplified programming of new remote control transmission data of an electronic apparatus which a user wants to remotely control. A plurality of electronic apparatuses are remote controlled by using a single common use remote control transmitter and by converting an infrared signal from an exclusive use remote control transmitter belonging to an electronic apparatus into another remote control transmitter data at a remote control signal analysis/output unit. The data is output as a magnetic signal, the magnetic signal is received, the signal is converted into new remote control transmitter data and the converted data is stored in a nonvolatile memory device.

8 Claims, 6 Drawing Sheets

REMOTE CONTROL SYSTEM

FIELD OF THE INVENTION

The present invention relates to a remote control system handling transmission data of a remote control transmitter for remote controlling various kinds of electronic apparatuses by using an infrared ray.

BACKGROUND OF THE INVENTION

Various kinds of electronic apparatuses having high performance and diversification have been developed and remote control transmitters used in these apparatuses providing with various functions have appeared in the market. Particularly, a remote control transmitter which stores data of a plurality of remote control transmitters and can control a plurality of electronic apparatuses such as a television receiver and a video deck manufactured by the same manufacturer by a single remote control transmitter has been popularly used.

Such a remote control transmitter which can remote control a plurality of electronic apparatuses of the same manufacture, a television receiver and a video deck having a built-in tuner, for example, provides with a tv/video selection switch as well as operation keys having common operation functions such as power on/off and channel selection, and is made to generate an infrared signal for remote controlling either apparatus by operating the tv/video selection switch depending on the case of operating a television receiver or a video deck.

Such a remote control transmitter of the prior art is explained below, referring to FIG. 6.

FIG. 6 is a block diagram of the main part of a remote control transmitter used in a remote control system of the prior art. In FIG. 6, block 101 is a plurality of operation keys such as for power on/off and channel selection. Block 102 is a microcomputer for storing various kinds of remote control transmission data for remote controlling a television receiver and a video deck of the same manufacturer in a built-in memory device, and outputting the data. Reference number 103 is an LED (light-emitting diode) for converting an electric signal output from microcomputer 102 into an infrared signal, and transmitting the infrared signal. A driver transistor 104 and a current limiting resistor 105 are connected with LED 103 in series.

Remote control transmitter 107 is composed by microcomputer 102 connected with tv/video selection switch 106 for selecting data supplied by microcomputer 102 for remote control transmission according to which is desired to remote control, a television receiver or a video deck.

A function of remote control transmitter 107 composed like the above is explained below.

In the case of remote controlling a television receiver, one of operation keys 101 is pressed after switching tv/video selection switch 106 to a television side. Microcomputer 102 works and generates remote control data stored in a built-in memory device and outputs an electric signal corresponding to the pressed key among operation keys 101.

The electric signal output from microcomputer 102 is applied to driver transistor 104, amplified there and drives LED 103. A current corresponding to the electric signal flows through current limiting resistor 105 and LED 103, LED 103 flashes and an infrared signal is transmitted. Thus, the television receiver is remote controlled by remote control transmitter 107.

In the case of remote controlling a video deck, the video deck is similarly remote controlled by switching tv/video selection switch 106 to a video deck side, using remote control transmission data stored in a memory device built in microcomputer 102 and for remote controlling a video deck.

As described above, a common use type remote control transmitter of the prior art is structured to remote control a television receiver and a video deck of the same manufacturer, by switching tv/video deck selection switch 106 of the remote control transmitter.

However, because the remote control transmission data stored in the memory device built in microcomputer 102 of the conventional common use type remote control transmitter can be used for the electronic apparatuses only from the same manufacturer, when the electronic apparatus such as a television receiver or a video deck is replaced by that of the other manufacturer or an electronic apparatus such as an audio apparatus is newly purchased (installed), the remote control transmission data do not generally coincide between the conventional remote control transmitter and the newly replaced or purchased apparatus. Accordingly, there exists such a problem that the conventional remote control-transmitter does work for the new apparatus.

There is a learning type remote control transmitter which can remote control even an apparatus which is manufactured by a different manufacturer or a newly installed electronic apparatus by transmitting and receiving an infrared signal between the electronic apparatuses. In this case, because such a learning-type remote control needs to be provided with a light receiving part for receiving an infrared signal from the electronic apparatus, an analysis circuit and microcomputer and the like to process the received infrared signal as an electric signal in the remote control transmitter, there is a problem that the remote control transmitter has a complicated structure and, thus, becomes expensive. An exemplary learning type remote control transmitter is found in U.S. Pat. No. 4,623,887 to Welles. As set forth at col. 4, line 14, et seq.:

... The transmitter is to be emulated is placed so that its transmitter infrared light emitting diode (LED) is adjacent the photoelectric receiver In the reconfigurable remote control unit. ... The user is then prompted ... to press a key on the reconfigurable remote control transmitter and a corresponding key on the transmitter to be emulated so that the transmitted code can be received and encoded.

In this manner, a reconfigurable remote control unit is programmed.

SUMMARY OF THE INVENTION

The present invention eliminates such problems of the prior art and aims to offer an inexpensive remote control system which can easily program remote control transmission data for an electronic apparatus of a different manufacturer or for a different kind of electronic apparatus in a designated remote control transmitter, and can remote control a plurality of electronic apparatuses in addition to the electronic apparatuses which the user has so far.

To eliminate the above problems, the present invention offers a remote control system providing a remote control signal analysis/output unit having a first electromagnetic induction means for receiving, at a light receiving part, an infrared signal from an exclusive use type remote control transmitter belonging to an electronic apparatus which the user wants to remote control by a new remote control system at a light receiving part, processing the signal at an analysis circuit, converting into data for remote control transmission and outputting it into a magnetic signal; and a common use type remote control transmitter having a second electromagnetic induction means for converting the magnetic signal output from the first electromagnetic induction means into an electric signal and a nonvolatile memory device converting the electric signal into a remote control transmission signal, storing and processing.

Thus, an inexpensive remote control system is obtained remote control transmission data for an electronic apparatus of a different manufacturer or a different kind can be easily programmed in a designated remote control transmitter and a plurality of electronic apparatuses can be remotely controlled.

DETAILED DESCRIPTION OF THE INVENTION

Exemplary embodiments of the present invention are explained below, referring to FIGS. 1 to 5.

Figure 6:
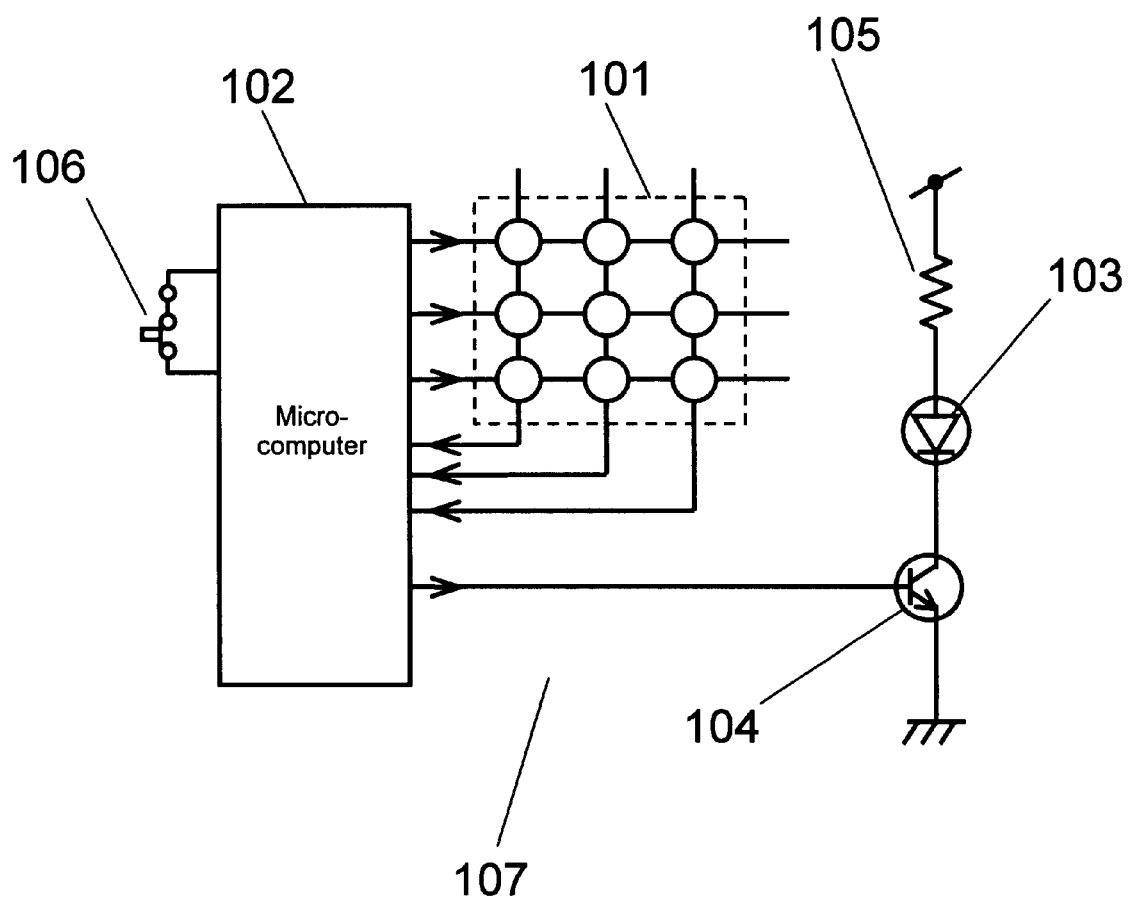
FIG. 6 is a block diagram of a main part of a remote control transmitter used in a remote control system of the prior art.

The parts having similar functions to those explained in BACKGROUND OF THE INVENTION are numbered with the same digit after subtracting a hundred from those numerals used in FIG. 6, and detailed explanations are omitted.

First Exemplary Embodiment

Figure 1:
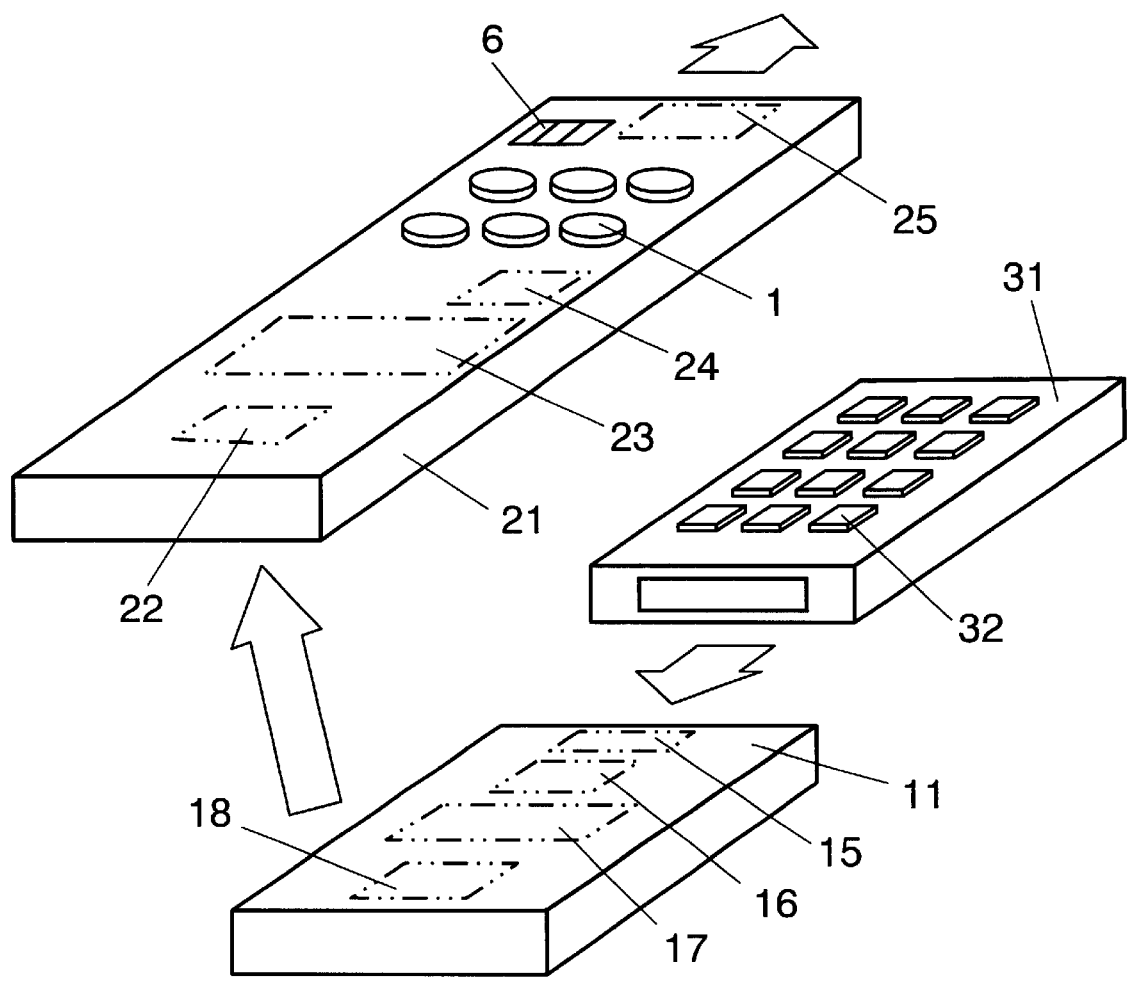
FIG. 1 shows an appearance of a unit using a remote control system in accordance with a first exemplary embodiment of the present invention.

FIG. 1 shows an appearance of a unit using a remote control system in accordance with a first exemplary embodiment of the present invention. In FIG. 1, block 11 is a remote control signal analysis/output unit. Block 21 is a common use type remote control transmitter in the present system. Block 31 is an exclusive use type remote control transmitter belonging to an newly replaced electronic apparatus manufactured by a different manufacturer from the one of the originally own, or belonging to a different kind of electronic apparatus newly purchased in addition. The remote control system of the first exemplary is composed by exclusive use remote control transmitter 31, remote control signal analysis/output unit 11 and common use type remote control transmitter 21.

Figure 2:
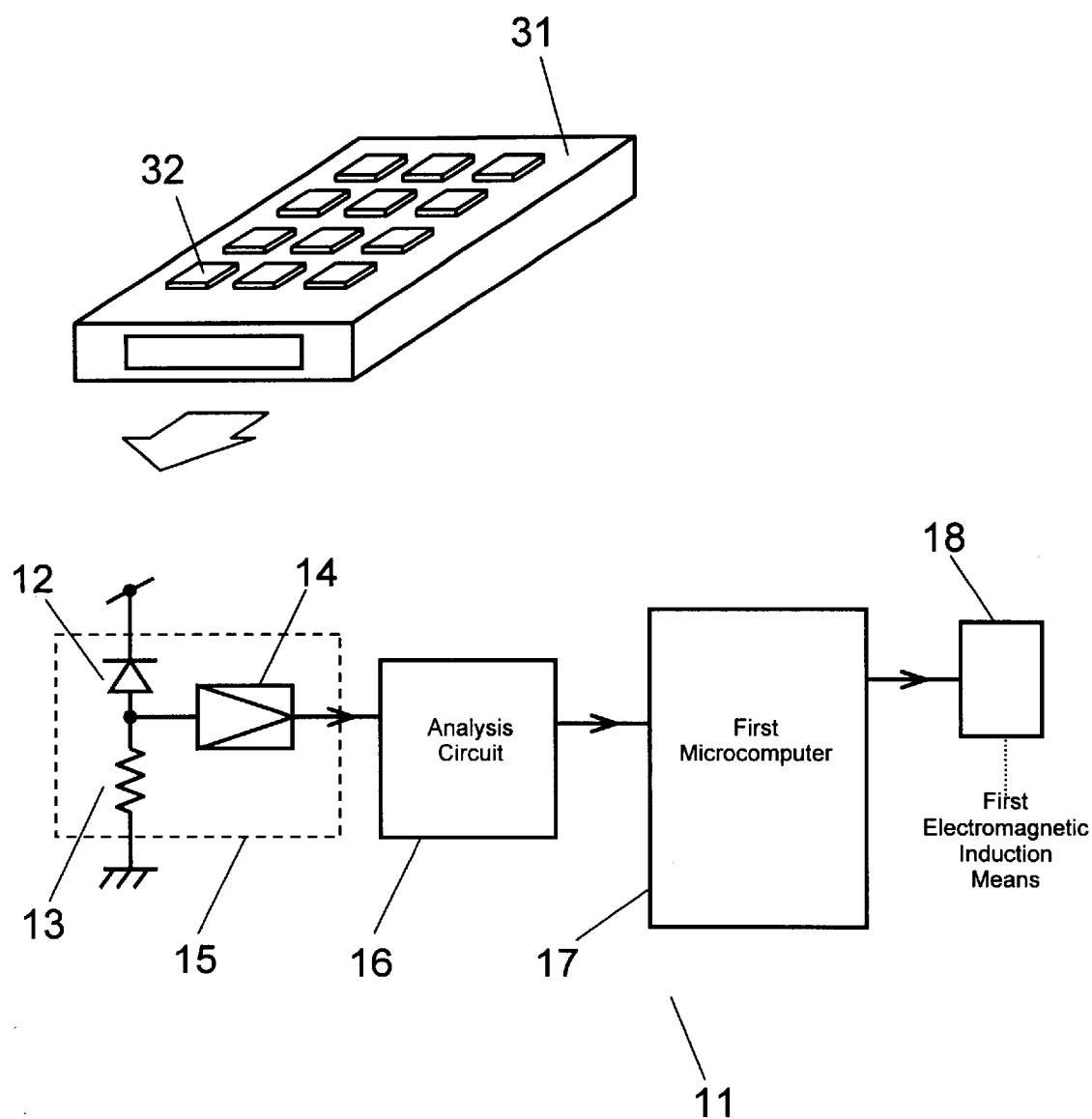
FIG. 2 is a block diagram of a main part of a remote control signal analysis/output unit used in the same remote control system.

Remote control signal analysis/output unit 11 includes light receiving part 15 including PIN photo diode 12, resistor 13 and amplifier 14, for receiving an infrared ray signal and converting it into an electric signal; analysis circuit 16 including an IC (integrated circuit) for processing the electric signal supplied from light receiving part 15 and converting it into remote control transmission data corresponding to a remote control of an electronic apparatus; first microcomputer 17 for converting the remote control transmission data from analysis circuit 16 into an electric signal as well as for controlling the work of the entire apparatus; and first electromagnetic induction means 18 for converting the electric signal into a magnetic signal as shown in the block diagram of the main part of FIG. 2.

Figure 3:
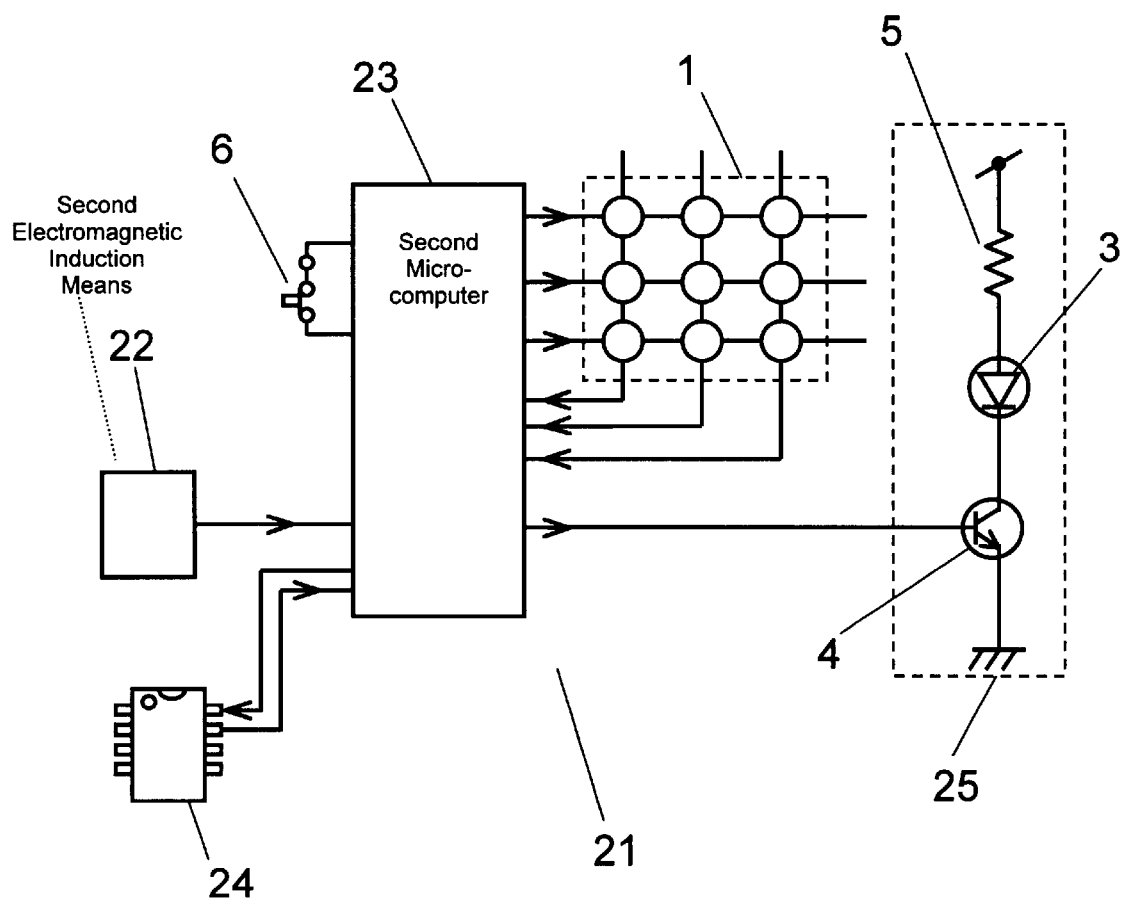
FIG. 3 is a block diagram of a main part of a remote control transmitter used in the same remote control system.

Remote control transmitter 21 includes a plurality of operation keys such as for power on/off and for tuner selection; second electromagnetic induction means 22 for converting a magnetic signal output from first electromagnetic induction means 18 of remote control signal analysis/output unit 11 into an electric signal; second microcomputer 23 for processing, converting the electric signal into a remote control transmission data and controlling the work of the entire transmitter, and first nonvolatile memory device 24 for storing the processed remote control transmission data, as shown in the block diagram of the main part of FIG. 3.

It is similar to the case of the prior art that second microcomputer 23 stores various kinds of remote control transmission data for remote controlling a television receiver and a video deck of the same manufacturer in a built-in memory device. Also, as seen in the prior art, infrared ray output means 25 composed of LED 3 for converting an electric signal supplied from second microcomputer 23 into an infrared signal and transmitting it, driver transistor 4 and current limiting resistor 5, and tv/video selection switch 6 for switching remote control transmission data taken from second microcomputer 23 according to which the user wants to control a television receiver or a video deck are connected to second microcomputer 23.

The performance of the remote control system composed like the above is explained below, taking the case that an apparatus such as a television receiver or a video deck is replaced to that of a different manufacturer, or a different kind such as an audio apparatus is purchased (installed) for instance.

First common use type remote control transmitter 21 is mounted on remote control signal analysis/output unit 11 making first electromagnetic induction means 18 and second electromagnetic induction means 22 magnetically coupled. Then operation key 32 of exclusive use type remote control transmitter 31 belonging to the new electronic apparatus is pressed for an infrared signal to be transmitted from exclusive use type remote control transmitter 31. PIN photo diode 12 of light receiving part 15 of remote control signal analysis/output unit 11 receives the infrared signal and converts it into an electric signal, and amplifier 14 amplifies the electric signal and outputs to analysis circuit 16.

Analysis circuit 16 analyzes the electric signal, converts it into remote control transmission data and supplies to first microcomputer 17. First microcomputer 17 processes the remote control transmission data, converts it into an electric signal, supplies to first electromagnetic induction means 18. First electromagnetic induction means 18 converts the supplied electric signal into a magnetic signal and outputs it.

The magnetic signal supplied from first electromagnetic induction means 18 of remote control signal analysis/output unit 11 is converted into an electric signal at second electromagnetic induction means 22 of magnetically coupled remote control transmitter 21. Second microcomputer 23 processes the electric signal and converts into remote control transmission data, and the converted data is stored in first nonvolatile memory device 24. Operation keys 32 and operation keys 1 may be pressed in the manner described, for example, in U.S. Pat. No. 4,623,887 in order to define the functions to be performed by operation keys 1 after storing of remote control transmission data is completed.

Repeating the above press action with each key of operation keys 32 of exclusive use type remote control transmitter 31, all the remote control transmission data of exclusive use type remote control transmitter 31 belonging to a new electronic apparatus which is necessary for remote control is stored in first nonvolatile memory device 24 of common use type remote control transmitter 21 through remote control signal analysis/output unit 11. Thus, storing of the remote control transmission data is completed.

As described above, when any one of operation keys 1 of common use type remote control transmitter 21 is pressed after storing the remote control transmission data of exclusive use type remote control transmitter 31 in first nonvolatile memory device 24 of common use type remote control transmitter 21 through remote control signal analysis/output unit 11, second microcomputer 23 receives remote control transmission data corresponding to the pressed key from first nonvolatile memory device 24 and outputs an electric signal. The electric signal is supplied to driver transistor 4 where it is amplified, and drives LED 3. A current corresponding to the electric signal flows through current limiting resistor 5, LED 3 flashes transmitting an infrared signal thus the new electronic apparatus is remotely controlled.

It is similar to the case of the prior art that a television receiver or a video deck which the user has used so far can be remotely controlled using various kinds of remote control transmission data stored in a built-in memory device in second microcomputer 23 for remote-controlling a television receiver and a video deck of the same manufacturer as the already owned apparatuses, and a television receiver or a video deck of the same manufacturer can be remote controlled with a single unit of remote control transmitter by switching a tv/video selection-switch 6.

Thus, according to the first exemplary embodiment of the present invention, a remote control system can be inexpensively obtained, where remote control transmission data for an electronic apparatus of a different manufacturer or a different kind in addition to the electronic apparatus which the user has used so far can be easily programmed, and a plurality of electronic apparatuses can be remote controlled with a single unit of common use type remote control transmitter by storing the remote control transmission data of exclusive use type remote control transmitter 31 belonging to a new electronic apparatus which the user wants to control using this remote control system in nonvolatile memory device 24 of common use type remote control transmitter 21 through remote control signal analysis/output unit 11.

In the above explanation, a case that remote control transmission data of exclusive use type remote control transmitter 31 belonging to a new electronic apparatus is stored in nonvolatile memory device 24 of common use type remote control transmitter 21 is explained as an example, but it is needless to say that it is possible to write the data in nonvolatile memory device 24 over and over, if the remote control transmission data of the exclusive use type remote control transmitter belonging to the other electronic apparatus than the one exclusive use type remote control transmitter 31 belongs to is within a storage capacity of nonvolatile memory device 24.

Although a composition that each of analysis circuit 16 and first microcomputer 17 is separately included in remote control signal analysis/output unit 11 is explained earlier, a remote control signal analysis/output unit 11 can be made simpler and cheaper by having analysis circuit 16 in first microcomputer 17.

Second Exemplary Embodiment

Figure 4:
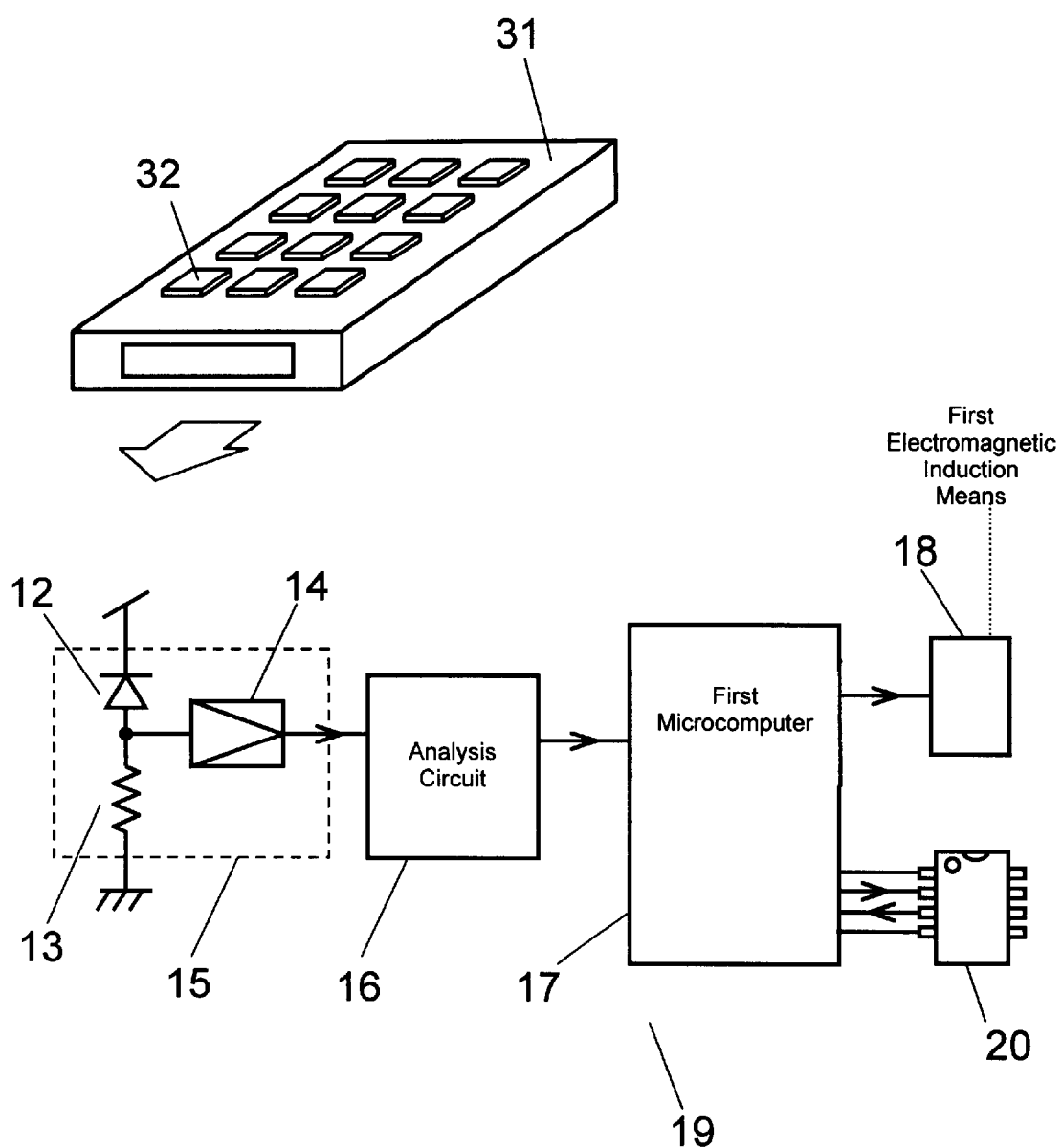
FIG. 4 is a block diagram of a main part of a remote control signal analysis/output unit used in a remote control system in accordance with a second exemplary embodiment of the present invention.

FIG. 4 is a block diagram of the main part of a remote control signal analysis/output unit used in a remote control system in accordance with the second exemplary embodiment of the present invention. In FIG. 4, it is similar to the case of the first exemplary embodiment that remote control signal analysis/output unit 19 includes light receiving part 15 including PIN photo diode 12, resistor 13 and amplifier 14, analysis circuit 16 including IC, first microcomputer 17 for converting a remote control transmission data into an electric signal and first electromagnetic induction means 18 for converting the electric signal into a magnetic signal. However, in this exemplary, second nonvolatile memory device 20 is connected to first microcomputer 17.

In second nonvolatile memory device 20, plural suites of remote control transmitter data for remote controlling a plurality of electronic apparatuses of main manufacturers which are popular in the market is preliminarily written, and in first microcomputer 17, a program for reading the designated remote control transmitter data from second nonvolatile memory device 20 is added.

The function of remote control signal analysis/output unit 19 composed like the above is explained below. When one of operation keys 32 of exclusive use type remote control transmitter 31 belonging to a newly installed electronic apparatus is pressed, an infrared signal is transmitted to light receiving part 15 of remote control signal analysis/output unit 19 where the infrared signal is converted into an electric signal. The electric signal is converted into remote control transmission data at analysis circuit 15 and supplied to first microcomputer 17. The function is similar to the case of the first exemplary embodiment. However, in this exemplary, first microcomputer 17 checks if there are any data which coincide with the input remote control transmission data of exclusive use type remote control transmitter 31 among plural suites of remote control transmission data stored in second nonvolatile memory device 20, which function makes the second exemplary different from the first exemplary embodiment of this invention.

This action is repeated some times at every press of operation keys 32 of exclusive use type remote control transmitter 31. In the case in which some of remote control transmission data from exclusive use type remote control transmitter 31 coincide with the remote control transmission data stored in second nonvolatile memory device 20, the coincident data in second nonvolatile memory device 20 are selected, then the selected remote control transmission data and all the remote control transmission data having a designated relation with the selected data are altogether supplied to first electromagnetic induction means 18 as electric signals.

The electric signals are altogether supplied to remote control transmitter 21, similar to the case of the first exemplary embodiment, after being converted into a magnetic signal at first electromagnetic induction means 18 then stored in first nonvolatile memory device 24 through second electromagnetic induction means 22 and second microcomputer 23. Thus, it becomes possible to remote control a newly installed electronic apparatus in addition to the electronic apparatuses which the user has used so far, using common use type remote control transmitter 21 of the present invention.

In the case in which some transmitted remote control transmission data of exclusive use type remote control transmitter 31 do not coincide with the remote control transmission data stored in second nonvolatile memory device 20 even if operation keys 32 of exclusive use type remote control transmitter 31 are pressed some times, all the remote control transmission data necessary for remote control are taken out from exclusive use type remote control transmitter 31 and stored in first nonvolatile memory device 24 of common use type remote control transmitter 21 through remote control signal analysis/output signal unit 19 and programmed there, like the case of the first exemplary embodiment.

Thus, according to the second exemplary embodiment of the present invention, second nonvolatile memory device 20 in which plural suites of remote control transmission data for remote controlling a plurality of electronic apparatuses are previously stored is connected to first microcomputer 17 and when some remote control transmission data supplied from exclusive use type remote control transmitter 31 coincide with the designated data among the remote control transmission data stored in second nonvolatile memory device 20, because all the remote control transmission data stored in exclusive use type remote control transmitter 31 can be altogether stored in first nonvolatile memory device 24 of remote control transmitter 21 of common use, there is no need of pressing all the operation keys 32 of exclusive use type remote control transmitter 31 and the time to store the remote control transmission data in first nonvolatile memory device 24 of common use type remote control transmitter 21 can be reduced and further it can be prevented to miss the writing of necessary data.

Figure 5:
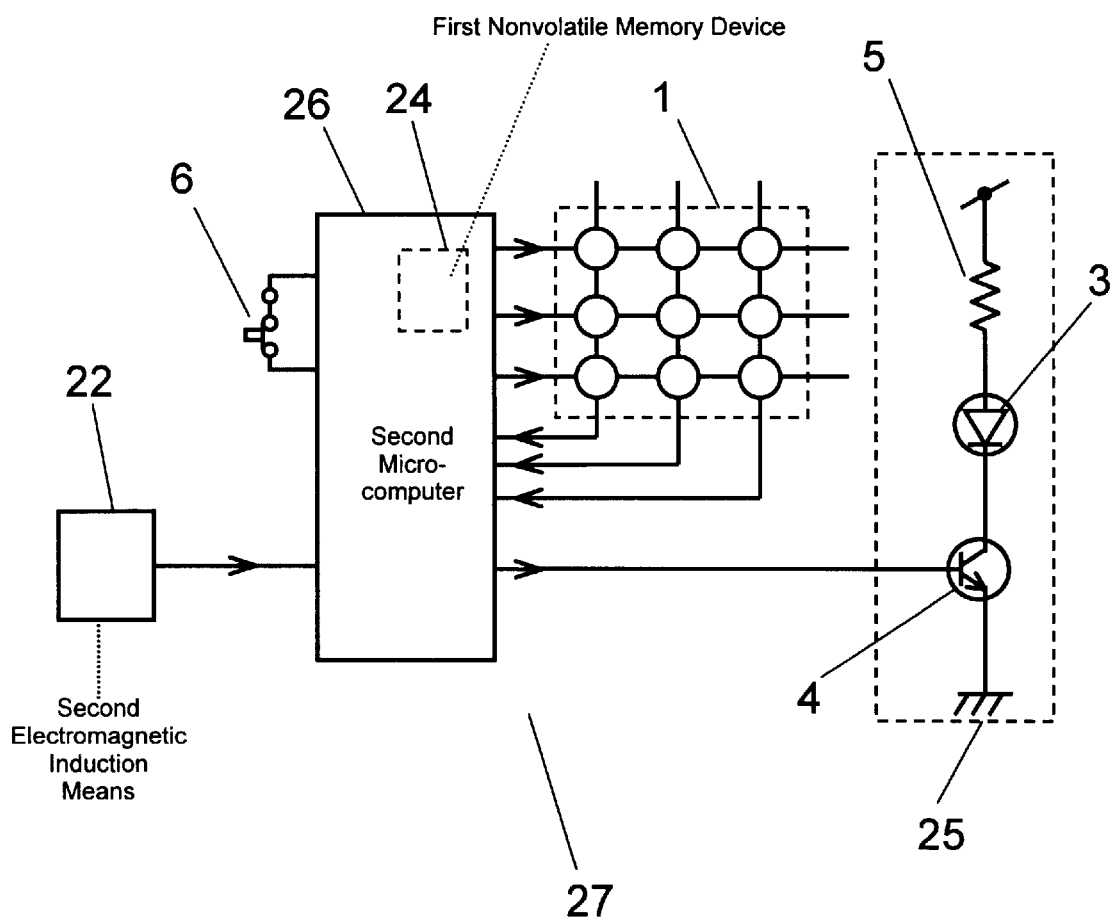
FIG. 5 is a block diagram of a main part of a remote control transmitter used in the same remote control system.

As shown in a block diagram of the main part of a remote control transmitter of FIG. 5, a remote control transmitter can be made simpler and cheaper by including nonvolatile memory device 24 in second microcomputer 26.

The remote control system of the present invention can be used for various purposes. For example, the remote control signal analysis/output unit is owned by an ordinary family for domestic use or by sales or repair shops for a customer service, inputting remote control transmission data for a remote control transmitter of a new apparatus which a customer is purchasing per request.

Thus, according to the present invention, an inexpensive remote control system can be obtained, where remote control transmitter data for an electronic apparatus of a different manufacturer or a different kind can be easily programmed in a designated remote control transmitter and a plurality of electronic apparatuses can be remote controlled with a single unit of remote control transmitter.

What is claimed is:

1. A remote control system comprising:
   remote control signal analysis and output means comprising:
      light receiving means for receiving and converting an infrared signal for remote controlling an electronic apparatus into a first electric signal;
      analysis means for processing and converting the first electric signal into first remote control transmission data;
      first microcomputer means for converting the first remote control transmission data into a second electric signal; and
      first electromagnetic induction means for converting the second electric signal into a magnetic signal; and
   remote control transmitter means comprising:
      second electromagnetic induction means for converting the magnetic signal output from the first electromagnetic induction means into a third electric signal;
      second microcomputer means for processing and converting the third electric signal into second remote control transmission data;
      first nonvolatile memory means for storing the second remote control transmission data;
      a plurality of operation keys for remote-controlling of said electronic apparatus; and
      infrared signal output means for generating an infrared signal according to an output of said second microcomputer means, said second microcomputer means transmitting said output upon (a) one of said operation keys being operated, and (b) transmission data corresponding to said operated key being retrieved from said first nonvolatile memory means and received by said second microcomputer means.

2. A remote control system as recited in claim 1, wherein said analysis means is built in said first microcomputer means.

3. A remote control system as recited in claim 1, wherein
   second nonvolatile memory means in which plural suites of remote control transmission data for remote controlling a plurality of electronic apparatuses are previously stored is connected to said first microcomputer means;
   said first microcomputer means compares remote control transmission data converted from the infrared signal received at said light receiving means with remote control transmission data stored in said second nonvolatile memory means; and
   coincident remote control transmission data and all the remote control transmission data having a designated relation with said coincident remote control transmission data are selected from said second nonvolatile memory means and are altogether supplied to said first electromagnetic induction means.

4. A remote control system as recited in claim 2, wherein
   second nonvolatile memory means in which plural suites of remote control transmission data for remote controlling a plurality of electronic apparatuses are previously stored is connected to said first microcomputer means;
   said first microcomputer means compares remote control transmission data converted from the infrared signal received at said light receiving means with remote control transmission data stored in said second nonvolatile memory means; and
   coincident remote control transmission data and all the remote control transmission data having a designated relation with said coincident remote control transmission data are selected from said second nonvolatile memory means and are altogether supplied to said first electromagnetic induction means.

5. A remote control system as recited in claim 1, wherein said first nonvolatile memory means is built in said second microcomputer means.

6. A remote control system as recited in claim 2, wherein said first nonvolatile memory means is built in said second microcomputer means.

7. A remote control system as recited in claim 3, wherein said first nonvolatile memory means is built in said second microcomputer means.

8. A remote control system as recited in claim 4, wherein said first nonvolatile memory means is built in said second microcomputer means.

* * * * *